(12) United States Patent
de Souza et al.

(10) Patent No.: US 8,598,006 B2
(45) Date of Patent: Dec. 3, 2013

(54) STRAIN PRESERVING ION IMPLANTATION METHODS

(75) Inventors: Joel P. de Souza, Putnam Valley, NY (US); Masafumi Hamaguchi, White Plains, NY (US); Ahmet S. Ozcan, Pleasantville, NY (US); Devendra K. Sadana, Pleasantville, NY (US); Katherine L. Saenger, Ossining, NY (US); Donald R. Wall, Poughkeepsie, NY (US)

(73) Assignees: International Business Machines Corporation, Armonk, NY (US); Toshiba America Electronic Components, Inc., Irvine, CA (US)

( * ) Notice: Subject to any disclaimer, the term of this patent is extended or adjusted under 35 U.S.C. 154(b) by 545 days.

(21) Appl. No.: 12/724,608

(22) Filed: Mar. 16, 2010

(65) Prior Publication Data

US 2011/0230030 A1   Sep. 22, 2011

(51) Int. Cl.
*H01L 21/336* (2006.01)

(52) U.S. Cl.
USPC ........... 438/303; 438/525; 438/300; 438/151; 438/689; 438/276; 257/350; 257/192; 257/368; 257/288

(58) Field of Classification Search
USPC ................ 438/303, 525, 300, 151, 698, 276; 257/350, 192, 368, 288
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 4,969,023 A | 11/1990 | Svedberg | |
| 5,006,913 A | 4/1991 | Sugahara et al. | |
| 5,060,030 A | 10/1991 | Hoke | |

(Continued)

FOREIGN PATENT DOCUMENTS

| | | |
|---|---|---|
| CN | 1591826 A | 3/2005 |
| JP | 6476755 | 3/1989 |

OTHER PUBLICATIONS

Rim et al., "Transductance Enhancement in Deep Submicron Strained-Si n-MOSFETs", International Electron Devices Meeting, IEEE, 1998, 26.8.1-26.8.4.

(Continued)

*Primary Examiner* — Fernando L Toledo
*Assistant Examiner* — Mohammed Shamsuzzaman
(74) *Attorney, Agent, or Firm* — Scully, Scott, Murphy & Presser, P.C.; Vazken Alexanian

(57) ABSTRACT

An embedded epitaxial semiconductor portion having a different composition than matrix of the semiconductor substrate is formed with a lattice mismatch and epitaxial alignment with the matrix of the semiconductor substrate. The temperature of subsequent ion implantation steps is manipulated depending on the amorphizing or non-amorphizing nature of the ion implantation process. For a non-amorphizing ion implantation process, the ion implantation processing step is performed at an elevated temperature, i.e., a temperature greater than nominal room temperature range. For an amorphizing ion implantation process, the ion implantation processing step is performed at nominal room temperature range or a temperature lower than nominal room temperature range. By manipulating the temperature of ion implantation, the loss of strain in a strained semiconductor alloy material is minimized.

16 Claims, 4 Drawing Sheets

(56) References Cited

U.S. PATENT DOCUMENTS

| | | |
|---|---|---|
| 5,081,513 A | 1/1992 | Jackson et al. |
| 5,108,843 A | 4/1992 | Ohtaka et al. |
| 5,134,085 A | 7/1992 | Gilgen et al. |
| 5,268,330 A | 12/1993 | Glvens et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,583,369 A | 12/1996 | Yamazaki et al. |
| 5,592,007 A | 1/1997 | Leedy |
| 5,592,009 A | 1/1997 | Hidaka |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,698,869 A * | 12/1997 | Yoshimi et al. ............... 257/192 |
| 5,840,593 A | 11/1998 | Leedy |
| 5,841,170 A | 11/1998 | Adan et al. |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,255,695 B1 | 7/2001 | Kubota et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,468,872 B1 | 10/2002 | Yang |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Myers et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,570,169 B2 * | 5/2003 | Suguro et al. ............ 250/492.21 |
| 6,605,498 B1 | 8/2003 | Murthy et al. |
| 6,621,131 B2 | 9/2003 | Murthy et al. |
| 6,621,392 B1 | 9/2003 | Volant et al. |
| 6,635,506 B2 | 10/2003 | Volant et al. |
| 6,657,244 B1 * | 12/2003 | Dokumaci et al. ............ 257/288 |
| 6,717,216 B1 | 4/2004 | Doris et al. |
| 6,806,584 B2 | 10/2004 | Fung et al. |
| 6,812,105 B1 * | 11/2004 | Dokumaci et al. ............ 438/300 |
| 6,815,278 B1 | 11/2004 | Ieong et al. |
| 6,825,529 B2 | 11/2004 | Chidambarrao et al. |
| 6,831,292 B2 | 12/2004 | Currie et al. |
| 6,869,866 B1 | 3/2005 | Chidambarrao et al. |
| 6,890,808 B2 | 5/2005 | Chidambarrao et al. |
| 6,930,030 B2 | 8/2005 | Rausch et al. |
| 6,974,981 B2 | 12/2005 | Chidambarrao et al. |
| 6,977,194 B2 | 12/2005 | Belyansky et al. |
| 6,998,657 B2 | 2/2006 | Rhodes |
| 7,015,082 B2 | 3/2006 | Doris et al. |
| 7,268,024 B2 | 9/2007 | Yeo et al. |
| 7,528,465 B2 | 5/2009 | King et al. |
| 7,759,207 B2 * | 7/2010 | Quek et al. ............... 438/303 |
| 7,868,306 B2 * | 1/2011 | Ramappa ............... 250/492.21 |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0013305 A1 * | 1/2003 | Sugii et al. ............... 438/689 |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0129791 A1 | 7/2003 | Yamazaki |
| 2003/0181005 A1 | 9/2003 | Hachimine et al. |
| 2004/0029323 A1 | 2/2004 | Shimizu et al. |
| 2004/0051144 A1 | 3/2004 | Webb et al. |
| 2004/0113174 A1 | 6/2004 | Chidambarrao et al. |
| 2004/0113217 A1 | 6/2004 | Chidambarrao et al. |
| 2004/0173815 A1 | 9/2004 | Yeo et al. |
| 2004/0238914 A1 | 12/2004 | Deshpande et al. |
| 2004/0262784 A1 | 12/2004 | Doris et al. |
| 2005/0014314 A1 * | 1/2005 | Dokumaci et al. ............ 438/151 |
| 2005/0017304 A1 | 1/2005 | Matsushita |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098234 A1 | 5/2005 | Nakaharai et al. |
| 2005/0098829 A1 | 5/2005 | Doris et al. |
| 2005/0106799 A1 | 5/2005 | Doris et al. |
| 2005/0139929 A1 | 6/2005 | Rost |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0022266 A1 | 2/2006 | Messenger et al. |
| 2006/0027868 A1 | 2/2006 | Doris et al. |
| 2006/0057787 A1 | 3/2006 | Doris et al. |
| 2006/0060925 A1 | 3/2006 | Doris et al. |
| 2006/0094212 A1 | 5/2006 | Noguchi et al. |
| 2006/0177998 A1 | 8/2006 | Lin et al. |
| 2006/0234455 A1 * | 10/2006 | Chen et al. ............... 438/276 |
| 2006/0246641 A1 | 11/2006 | Kammler et al. |
| 2007/0257315 A1 | 11/2007 | Bedell et al. |
| 2008/0258220 A1 * | 10/2008 | Bedell et al. ............... 257/350 |
| 2008/0311732 A1 * | 12/2008 | Dokumaci et al. ............ 438/525 |
| 2009/0050972 A1 * | 2/2009 | Lindsay et al. ............... 257/368 |
| 2010/0084529 A1 * | 4/2010 | Ramappa ............... 250/492.21 |
| 2011/0212592 A1 * | 9/2011 | Nieh et al. ............... 438/306 |
| 2012/0100686 A1 * | 4/2012 | Lu et al. ............... 438/303 |

OTHER PUBLICATIONS

Rim et al., "Characteristics and Device Design of Sub-100 nm Strained Si N- and PMOSFETs", Symposium on VLSI Technology Digest of Technical Papers, IEEE, 2002, pp. 98-99.

Scott et al., NMOS Drive Current Reduction Caused by Transistor Layout and Trench Isolation Induced Stress, International Electron Devices Meeting, IEEE, 1999, 34.4.1-34.4.4.

(56) References Cited

OTHER PUBLICATIONS

Ootsuka et al., "A Highly Dense, High-Performance 130nm Node CMOS Technology for Large Scale System-on-a-Chip Applications", International Electron Devices Meeting, IEEE, 2000, 23.5.1-23.5.4.

Ito et al., "Mechanical Stress Effect of Etch-Stop Nitride and its Impact on Deep Submicron Transistor Design", International Electron Devices Meeting, IEEE, 2000, 10.7.1-10.7.4.

Shimizu et al., "Local Mechanical-Stress Control (LMC): A New Technique for CMOS-Performance Enhancement", International Electron Devices Meeting, IEEE, 2001, 19.4.1-19.4.4.

Ota et al., "Novel Locally Strained Channel Technique for High Performance 55nm CMOS", International Electron Devices Meeting, IEEE, 2002, pp. 27-30, 2.2.1-2.2.4.

Zhang et al. "A New 'Mixed-Mode' Reliability Degradation Mechanism in Advanced Si and SiGe Bipolar Transistors", IEEE, 2002, pp. 2151-2156.

Momose et al., "Temperature Dependence of Emitter-Base Reverse Stress Degradation and its Mechanism Analyzed by MOS Structures", IEEE, Paper 6.2, 1989, pp. 140-143.

Huang et al., "Temperature Dependence and Post-Stress Recovery of Hot Electron Degradation Effects in Bipolar Transistors", Bipolar Circuits and technology Meeting 7.5, IEEE, 1991, pp. 170-173.

Sheng et al., "Degradation and Recovery of SiGe HBTs Following Radiation and Hot-Carrier Stressing", pp. 14-15.

Yang et al., "Avalanche Current Induced Hot Carrier Degradation in 200GHz SiGe Heterojunction Bipolar Transistors".

Li et al., "Design of W-Band VCOs with high Output Power for Potential Application in 77GHz Automotive Radar Systems", GaAs Digest, IEEE, 2003, pp. 263-266.

Wurzer et al, "Annealing of Degraded non-Transistors-Mechanisms and Modeling", Transactions on Electron Devices, IEEE, 1994, pp. 533-538, vol. 41, No. 4.

Doyle et al., "Recovery of Hot-Carrier Damage in Reoxidized Nitrided Oxide MOSFET's" Electron Device Letters, IEEE, 1992, pp. 38-40, vol. 13, No. 1.

Momose et al., "Analysis of the Temperature Dependence of Hot-Carrier-Induced Degradation in Bipolar Transistors for Bi-CMOS", Transactions on Electron Devices, IEEE, 1994, pp. 978-987, vol. 41, No. 6.

Khater et al., "Site HBT Technology with Fmax/Ft = 350/300 GHz and Gate Delay Below 3.3 ps", IEEE, 2004.

Bean et al., "GEx Si1-x/Si Strained-Layer Superlattice Grown by Molecular Beam Epitaxy", J. Vac. Sci. Technol., 1984, pp. 436-440, vol. A 2, No. 2.

Van Der Merwe, "Regular Articles", Journal of Applied Physics, 1963, pp. 117-122, vol. 34, No. 1.

Matthews et al., "Defects in Epitaxial Multilayers", Journal of Crystal Growth, 1974, pp. 118-125, vol. 27.

Iyer et al., "Heterojunction Bipolar Transistors Using Si-Ge Alloys", Transactions on Electron Devices, IEEE, 1989, pp. 2043-2064, vol. 36, No. 10.

Van De Leur et al., "Critical Thickness for Pseudomorphic Growth of Si/Ge Alloys and Superlattices", J. Appl, Phys., 1988, pp. 3043-3050, vol. 64, No. 6.

Houghton et al., "Equilibrium Critical Thickness for Si1-xGex Strained Layers on (100) Si", Appl. Phys. Lett., 1990, pp. 460-462, vol. 56, No. 29.

Ouyang et al, "Two-Dimensional Bandgap Engineering in a Novel Si/SiGe pMOSFET With Enhanced Device Performance and Scalability," IEEE, 2000, pp. 151-154.

U.S. Appl. No. 69/648,926, filed Nov. 15, 2005, Clevenger et al.

\* cited by examiner

STRAIN PRESERVING ION IMPLANTATION METHODS

FIELD OF THE INVENTION

The present invention relates to semiconductor manufacturing methods, and particularly to methods of preserving strain in silicon-containing semiconductor alloys through ion implantation processing steps.

BACKGROUND OF THE INVENTION

Providing some degree of strain to the channel of a semiconductor device such an n-type field effect transistor (NFET) or a p-type field effect transistor (PFET) to improve device performance is known in the art. High performance semiconductor devices employ such strain to provide higher carrier mobility, lower transistor on-resistance, increased drive current (on-current), etc.

One method of providing strain to the channel of a semiconductor device is to embed a lattice-mismatched and epitaxially aligned semiconductor material adjacent to the channel of the field effect transistor. Exemplary latticed mismatched materials that may be embedded into a silicon substrate to provide a strain to a channel comprising silicon include a silicon-germanium alloy, a silicon-carbon alloy, a silicon-germanium-carbon alloy, etc. The placement of the embedded lattice-mismatched and epitaxially aligned semiconductor material in proximity to the channel induces a compressive strain or a tensile strain in the channel. Typically, a compressive strain is employed to enhance the charge carrier mobility of a PFET, and a tensile strain is employed to enhance the charge carrier mobility of an NFET. The greater the strain, the greater the enhancement of the charge carrier mobility and the enhancement of performance, as long as epitaxial alignment between the embedded semiconductor material and the semiconductor material of the substrate is maintained.

Some of the most destructive processing steps that often serve to reduce the stain generated by embedded semiconductor material portions are ion implantation steps that are employed to dope portions of the semiconductor substrate. Such ion implantation steps include deep source/drain ion implantation steps (or "source/drain ion implantation" steps), source/drain extension ion implantation steps (or "extension ion implantation" steps), and halo ion implantation steps. Such ion implantation steps introduce crystalline defects into the embedded semiconductor material portions, and thereby induce reduction of the magnitude of the strain applied to the channel of the semiconductor device. Such reduction in the magnitude of the strain reduces the degree of performance enhancement in the semiconductor devices.

SUMMARY OF THE INVENTION

The present invention provides methods of preserving strain in a semiconductor portion throughout ion implantation steps, wherein the strain in the semiconductor portion is induced by embedded semiconductor portions.

In the present invention, an embedded epitaxial semiconductor portion having a different composition than the matrix of the semiconductor substrate is formed with a lattice mismatch and epitaxial alignment with the matrix of the semiconductor substrate. The temperature of subsequent ion implantation steps is manipulated depending on the amorphizing or non-amorphizing nature of the ion implantation process. For a non-amorphizing ion implantation process, the ion implantation processing step is performed at an elevated temperature, i.e., a temperature greater than nominal room temperature range between 10 degrees Celsius and 30 degrees Celsius. For an amorphizing ion implantation process, the ion implantation processing step is performed at nominal room temperature range or a temperature lower than nominal room temperature range. By manipulating the temperature of ion implantation, the loss of strain in a strained semiconductor alloy material is minimized.

According to an aspect of the present invention, a method of forming a semiconductor structure is provided. The method includes: forming a strained semiconductor material portion directly on a semiconductor substrate, wherein the strained semiconductor material portion is epitaxially aligned to the semiconductor substrate and is lattice-mismatched relative to a semiconductor material of the semiconductor substrate; implanting dopant ions into the strained semiconductor material portion at a non-amorphizing dose at an elevated temperature greater than nominal room temperature range between 10 degrees Celsius and 30 degrees Celsius; and annealing the implanted strained semiconductor material portion at a temperature that removes structural damages induced by implantation of the dopant ions.

According to another aspect of the present invention, another method of forming a semiconductor structure is provided. The method includes: forming a strained semiconductor material portion directly on a semiconductor substrate, wherein the strained semiconductor material portion is epitaxially aligned to the semiconductor substrate and is lattice-mismatched relative to a semiconductor material of the semiconductor substrate; implanting dopant ions into the strained semiconductor material portion at an amorphizing dose at a temperature lower than nominal room temperature range between 10 degrees Celsius and 30 degrees Celsius; and annealing the implanted strained semiconductor material portion at a temperature that removes structural damages induced by implantation of the dopant ions.

According to yet another aspect of the present invention, yet another method of forming a semiconductor structure is provided. The method includes: forming a strained semiconductor material portion directly on a semiconductor substrate, wherein the strained semiconductor material portion is epitaxially aligned to the semiconductor substrate and is lattice-mismatched relative to a semiconductor material of the semiconductor substrate; implanting first dopant ions into the strained semiconductor material portion at a non-amorphizing dose at a first temperature greater than nominal room temperature range between 10 degrees Celsius and 30 degrees Celsius; implanting second dopant ions into the strained semiconductor material portion at an amorphizing dose at a second temperature lower than nominal room temperature range; and annealing the strained semiconductor material portion after implanting the first and second dopant ions at a temperature that removes structural damages induced by implantation of the dopant ions.

According to still another aspect of the present invention, still another method of forming a semiconductor structure is provided. The method includes: forming a gate dielectric and a gate electrode on a top surface of a single crystalline semiconductor layer having a doping of a first conductivity type and located in a semiconductor substrate; forming at least one strained semiconductor material portion directly on the single crystalline semiconductor layer, wherein the at least one strained semiconductor material portion is epitaxially aligned to the semiconductor substrate and is lattice-mismatched relative to a semiconductor material of the single crystalline semiconductor layer; performing a halo ion implantation at a first temperature higher than nominal room temperature range between 10 degrees Celsius and 30 degrees Celsius, wherein dopant ions of the first conductivity type are implanted into the at least one strained semiconductor material portion at a non-amorphizing dose; performing a source/drain ion implantation at a second temperature lower than nominal room temperature range, wherein dopants of a second conductivity type are implanted into the at least one strained semiconductor material portion at an amorphizing dose; and annealing the strained semiconductor material portion after performing the halo ion implantation and the source/drain ion implantation at a temperature that removes structural damages induced by implantation of the dopant ions.

DETAILED DESCRIPTION OF THE INVENTION

Figure 1:
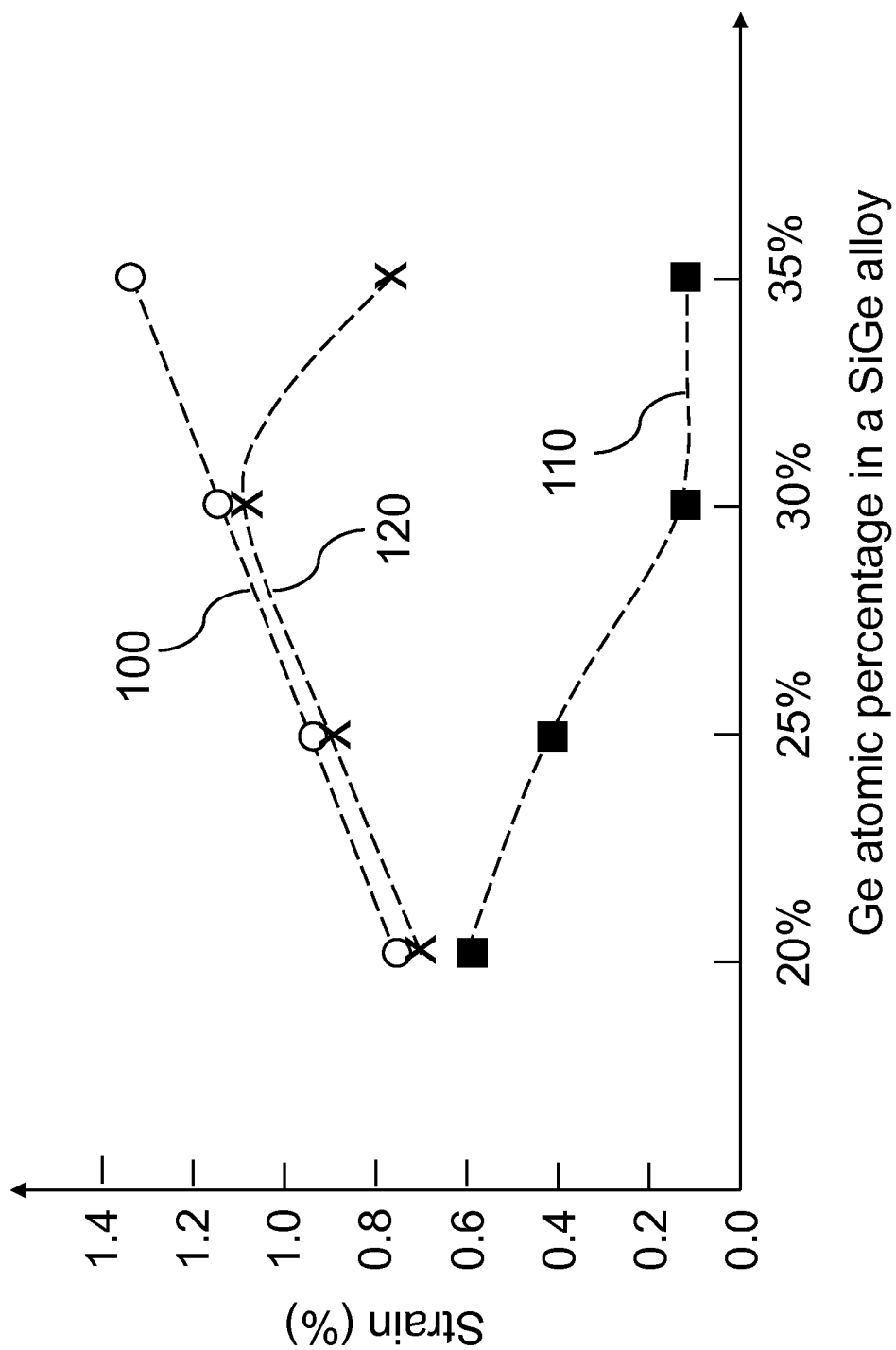
FIG. 1. is a graph showing composition dependence of residual strain for a non-amorphizing ion implantation process performed at different temperatures.

As stated above, the present invention relates to semiconductor manufacturing methods, and particularly to methods of preserving strain in silicon-containing semiconductor alloys through ion implantation processing steps, which are described herein with accompanying figures. The drawings are not necessarily drawn to scale.

According to the present invention, a strained semiconductor material portion is formed directly on a semiconductor substrate. In some cases, the strained semiconductor material portion may be formed embedded in the semiconductor substrate. The strained semiconductor material portion may be an unpatterned blanket layer, or may be a patterned and present in an area of the semiconductor substrate that is less than the entire area of the semiconductor substrate.

The semiconductor material of the semiconductor substrate, which is herein referred to as a first semiconductor material, is a single crystalline semiconductor material, and may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise single crystalline silicon.

The strained semiconductor material portion comprises a second semiconductor material which has a different composition than the first semiconductor material. The second semiconductor material is another single crystalline semiconductor material, and may be selected from the same semiconductor materials that may be employed for the first semiconductor material provided that the second semiconductor material has a different composition than the first semiconductor material. The strained semiconductor material portion is epitaxially aligned to the semiconductor substrate, and is lattice-mismatched relative to the first semiconductor material of the semiconductor substrate. The lattice mismatch between the first semiconductor material and the second semiconductor material is the source of the strain exerted on the strained semiconductor material portion by the first semiconductor material in the semiconductor substrate.

In a first embodiment of the present invention, dopant ions are implanted into the strained semiconductor material portion at a non-amorphizing dose at an elevated temperature than is greater than nominal room temperature range (10-30 degrees Celsius). The dopant ions are ions of electrical dopant atoms that dope the semiconductor material as a p-type material or an n-type material. For example, the dopant ions may be ions of B, $BF_2$, Ga, In, P, As, and Sb. A non-amorphizing dose herein refers to a dose that preserves crystalline structure of the strained semiconductor material portion. A crystalline structure herein refers to a structure that is better characterized as having crystalline alignment among atoms than as having amorphous alignment among the atoms. A crystalline structure may include structural defects such as point defects and line defects. A non-amorphizing dose herein refers to a dose that renders the strained semiconductor material portion crystalline after ion implantation within nominal room temperature range despite the presence of crystalline defects.

The range of the non-amorphizing dose for a given material for the strained semiconductor material portion depends on the species of the implanted ions and the energy employed for the ion implantation. The atomic concentration of implanted ions after an ion implantation at a non-amorphizing dose may be from $1.0 \times 10^{13}/cm^3$ to $1.0 \times 10^{20}/cm^3$, and typically from $1.0 \times 10^{15}/cm^3$ to $1.0 \times 10^{19}/cm^3$, although lesser and greater atomic concentrations may also provide a non-amorphizing dose under some conditions.

The elevated temperature may be any temperature greater than nominal room temperature range between 10 degrees Celsius and 30 degrees Celsius and less than the melting temperature of the second semiconductor material. Nominal room temperature range herein refers to a temperature range in a habitable room and for normal ambient temperature range in a semiconductor fabrication facility. Specifically, nominal room temperature range herein refers to a temperature range within 10 degrees Celsius and 30 degrees Celsius. In practical terms, the elevated temperature may be between 30 degrees Celsius and 700 degrees Celsius. A preferred range of the elevated temperature may be between 100 degrees Celsius and 600 degrees Celsius. A more preferred range of the elevated temperature may be between 200 degrees Celsius and 500 degrees Celsius. By elevating the temperature of the semiconductor substrate, and thereby elevating the temperature of the stressed semiconductor material portion, a higher percentage of the stress in the stressed semiconductor material portion is preserved through the ion implantation step at the elevated temperature compared with an ion implantation process performed at nominal room temperature range.

Referring to FIG. 1, a graph is shown in which the magnitude of a residual strain after an activation anneal is compared across various samples including a strained semiconductor material portion comprising a second semiconductor material and embedded in a semiconductor substrate comprising a first semiconductor material. The first semiconductor material is silicon, and the second semiconductor material is a silicon germanium alloy. The strained semiconductor material portion is a blanket film over a silicon substrate. The horizontal axis represents the atomic percentage of germanium, and the vertical axis represents the strain in percentage. Each point represents a different sample. All samples were subjected to an activation anneal, which is an anneal employed to remove structural damages in the strained semiconductor material portion and to activate dopants, if present, in the strained semiconductor material portion, at 1,080 degree Celsius for 1 second.

The data points represented by circles and connected by a first line 100 represent samples that are not implanted with any dopant ions. The data points represented by filled squares and connected by a second line 110 represent samples that are implanted at nominal room temperature range with arsenic ions at a non-amorphizing dose of $2.0\times10^{13}/cm^2$ at 50 keV of implantation energy at 30 degree tilt angle from the surface normal of the strained semiconductor material portion. The data points represented by "X" marks and connected by a third line 120 represent samples that are implanted at 300 degrees Celsius with arsenic ions at a non-amorphizing dose of $2.0\times10^{13}/cm^2$ at 50 keV of implantation energy at 30 degree tilt angle from the surface normal of the strained semiconductor material portion.

Comparison of the measured data for residual strain after the activation anneal shows that the samples represented by the "X" marks and connected by the third line 120 retain more residual strain relative to the sampled represented by the filled squares and connected by the second line 110. By elevating the ion implantation temperature, the amount of residual strain is increased for the non-amorphizing ion implantation.

In a second embodiment of the present invention, dopant ions are implanted into the strained semiconductor material portion at an amorphizing dose at a cooled temperature than is lower than nominal room temperature (10-30 degrees Celsius). As in the first embodiment, the dopant ions may be ions of B, $BF_2$, Ga, In, P, As, and Sb. An amorphizing dose herein refers to a dose that destroys crystalline structure of the strained semiconductor material portion and renders the strained semiconductor material portion substantially amorphous. A substantially amorphous structure herein refers to a structure that is better characterized as having random or amorphous alignment among atoms than as having crystalline alignment among the atoms. An amorphizing dose herein refers to a dose that renders the strained semiconductor material portion amorphous after ion implantation at nominal room temperature range.

The range of the amorphizing dose for a given material for the strained semiconductor material portion depends on the species of the implanted ions and the energy employed for the ion implantation. The atomic concentration of implanted ions after an ion implantation at an amorphizing dose may be from $1.0\times10^{19}/cm^3$ to $1.0\times10^{22}/cm^3$, and typically from $1.0\times10^{20}/cm^3$ to $1.0\times10^{21}/cm^3$, although lesser and greater atomic concentrations may also provide a non-amorphizing dose under some conditions.

The cooled temperature may be any temperature lower than nominal room temperature range and greater than 0 K. In practical terms, the cooled temperature may be between −267 degrees Celsius (the boiling temperature of Helium) and 10 degrees Celsius. A preferred range of the cooled temperature may be between −200 degrees Celsius and 0 degree Celsius. A more preferred range of the cooled temperature may be between −200 degrees Celsius and −50 degrees Celsius. By cooling the semiconductor substrate, and thereby cooling the stressed semiconductor material portion, a higher percentage of the stress in the stressed semiconductor material portion is preserved through the ion implantation step at an amorphizing dose compared with an ion implantation process performed at nominal room temperature range.

Figure 2:
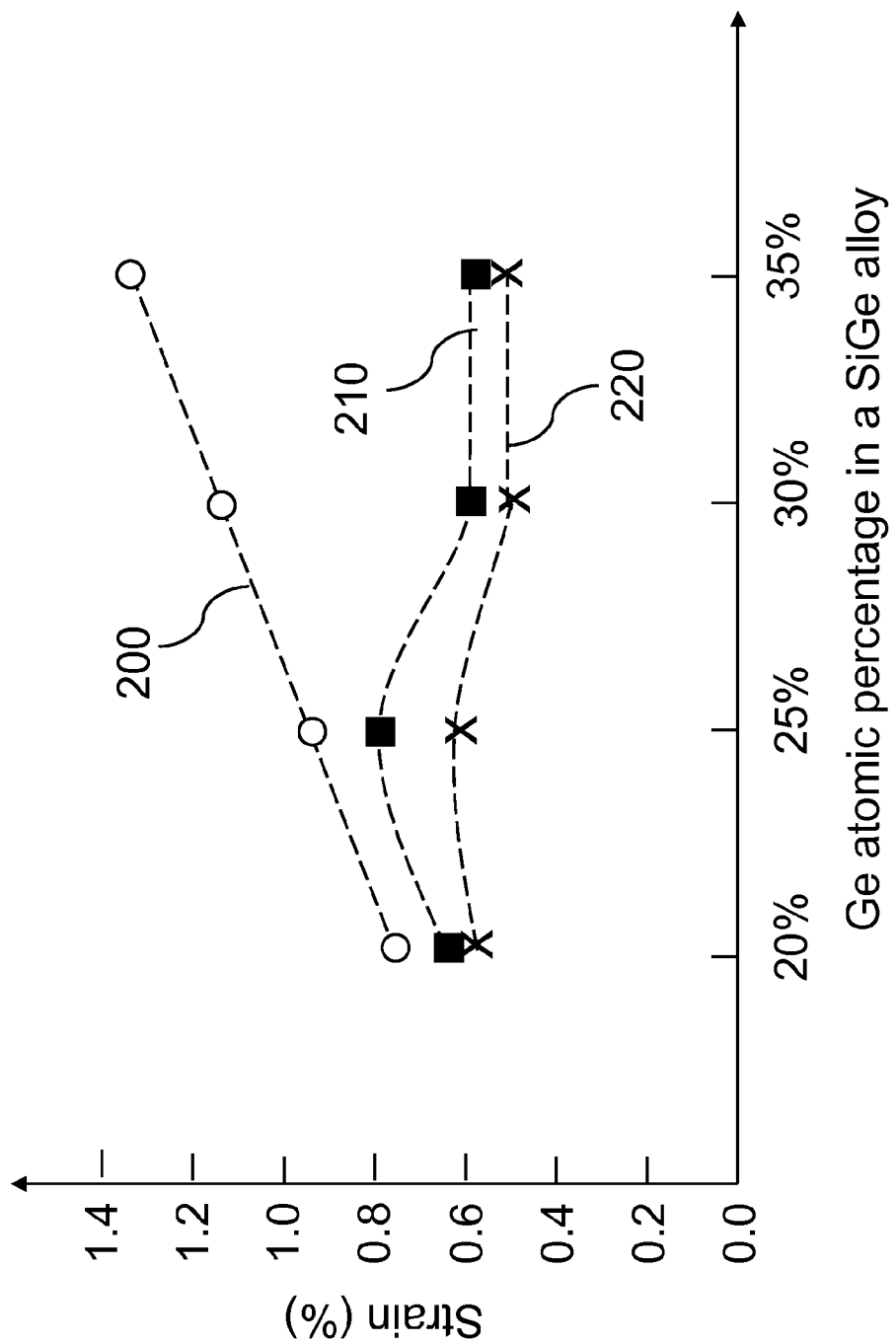
FIG. 2 is a graph showing composition dependence of residual strain for an amorphizing ion implantation process performed at different temperatures.

Referring to FIG. 2, a graph is shown in which the magnitude of a residual strain after an activation anneal is compared across various samples including a strained semiconductor material portion comprising a second semiconductor material and embedded in a semiconductor substrate comprising a first semiconductor material. The first semiconductor material is silicon, and the second semiconductor material is a silicon germanium alloy. The strained semiconductor material portion is a blanket film over a silicon substrate. The horizontal axis represents the atomic percentage of germanium, and the vertical axis represents the strain in percentage. Each point represents a different sample. All samples were subjected to an activation anneal, which is an anneal employed to remove structural damages in the strained semiconductor material portion and to activate dopants, if present, in the strained semiconductor material portion, at 1,080 degree Celsius for 1 second.

The data points represented by circles and connected by a fourth line 200 represent samples that are not implanted with any dopant ions. The data points represented by filled squares and connected by a fifth line 210 represent samples that are implanted at nominal room temperature range with $BF_2$ ions at an amorphizing dose of $3.0\times10^{15}/cm^2$ at 9 keV of implantation energy without tilt from the surface normal of the strained semiconductor material portion. The data points represented by "X" marks and connected by a sixth line 220 represent samples that are implanted at 300 degrees Celsius with $BF_2$ ions at an amorphizing dose of $3.0\times10^{15}/cm^2$ at 9 keV of implantation energy without tilt from the surface normal of the strained semiconductor material portion. The ion implantation conditions selected for the data points for the fifth line 210 and the sixth line 220 correspond to the step of source/drain ion implantation in standard complementary metal-oxide-semiconductor (CMOS) processing.

Comparison of the measured data for residual strain after the activation anneal shows that the samples represented by the "X" marks and connected by the sixth line 220 retain more residual strain relative to the sampled represented by the filled squares and connected by the fifth line 210. Ion implantation at an amorphizing dose at nominal room temperature range allows retention of more strain than ion implantation at the same amorphizing dose at 300 degrees Celsius. By extension, ion implantation at a temperature lower than nominal room temperature range provides more retention of residual strain than ion implantation at nominal room temperature range if other conditions of the ion implantation are the same.

Figure 3:
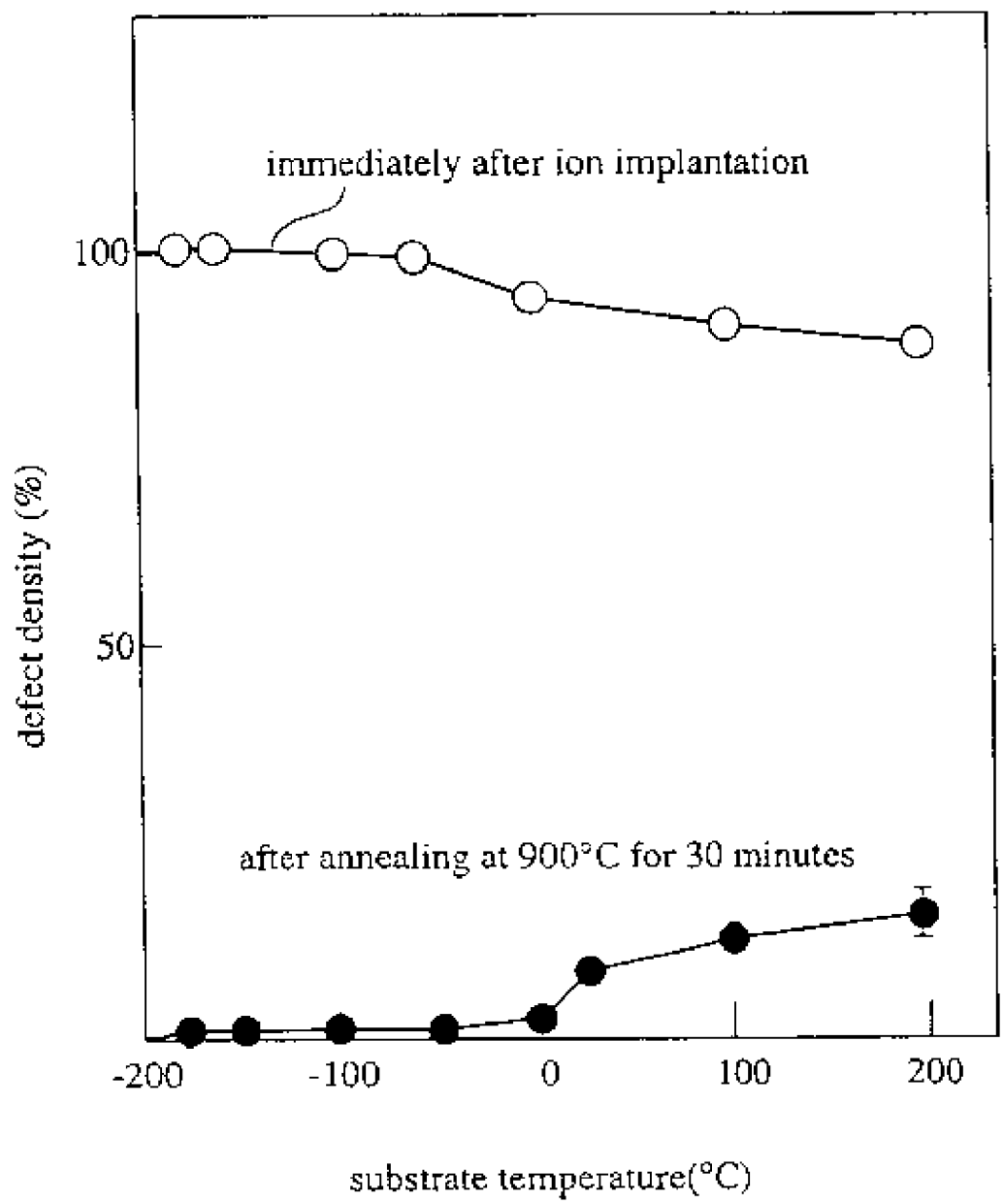
FIG. 3 is a graph showing the effect of a low temperature ion implantation on defect density.

Referring to FIG. 3, a graph from U.S. Pat. No. 6,570,169 to Suguro shows the effect of lowering temperature during ion implantation on the defect density in a non-strained semiconductor material immediately after ion implantation and after an activation anneal. While a lower temperature increases the defect density immediately after ion implantation, the post-anneal defect density is lower for samples implanted at low temperature. While this data is indicative of the defect density, and is not suggestive of the effect on the stain, this data provides theoretical support for retention of more stress in samples implanted at a reduced temperature in the series of experiments that led to the present invention.

Similar tests employing ion implantation conditions for source/drain extension ion implantations show the same trend. Table 1 below shows the results of similar testing on a semiconductor structure in which the semiconductor substrate is a single crystalline silicon substrate and the strained semiconductor material portion is a 60 nm thick silicon germanium carbon alloy layer in which the germanium concentration is 30%. The ion implantation conditions correspond to a typical condition for a source/drain extension implantation.

TABLE 1 residual strain for 60 nm thick silicon germanium
carbon film on silicon

| sample | ion species | beam current (mA) | Temperature (° C.) | Anneal temperature (° C.) | Residual strain (%) | Percentage strain loss (%) |
|---|---|---|---|---|---|---|
| A1 | $BF_2$ | 5.0 | 20 | 1,065 | 1.08 | 0.7 |
| A2 | $BF_2$ | 0.5 | 400 | 1,065 | 0.52 | 53 |
| A3 | $BF_2$ | 5.0 | 400 | 900 | 0.68 | 37 |

Table 2 below shows the results a similar testing on a semiconductor structure in which the semiconductor substrate is a single crystalline silicon substrate and the strained semiconductor material portion is a 60 nm thick silicon germanium alloy in which the germanium concentration is 30%. The ion implantation conditions correspond to a typical condition for a source/drain extension implantation.

TABLE 2 residual strain for 60 nm thick silicon germanium
carbon film on silicon

| sample | ion species | beam current (mA) | Temperature (° C.) | Anneal temperature (° C.) | Residual strain (%) | Percentage strain loss (%) |
|---|---|---|---|---|---|---|
| B1 | $BF_2$ | 5.0 | 20 | 1,065 | 1.07 | 3.5 |
| B2 | $BF_2$ | 5.0 | 400 | 1,065 | 0.36 | 68 |

The data from Tables 1 and 2 show that the residual strain is greater in the strained semiconductor material portion of the sample implanted at nominal room temperature range than in the strained semiconductor material portion of the sample implanted at 400 degrees Celsius when other conditions are the same.

In a third embodiment of the present invention, the temperature of strained semiconductor material portions is manipulated depending on whether the dose of in each ion implantation step is amorphizing or non-amorphizing. Non-amorphizing ion implantation steps are performed at an elevated temperature, and amorphizing ion implantation steps are performed at a temperature lower than nominal room temperature range. As in previous embodiments, the dopant ions may be ions of B, $BF_2$, Ga, In, P, As, and Sb.

Figure 4:
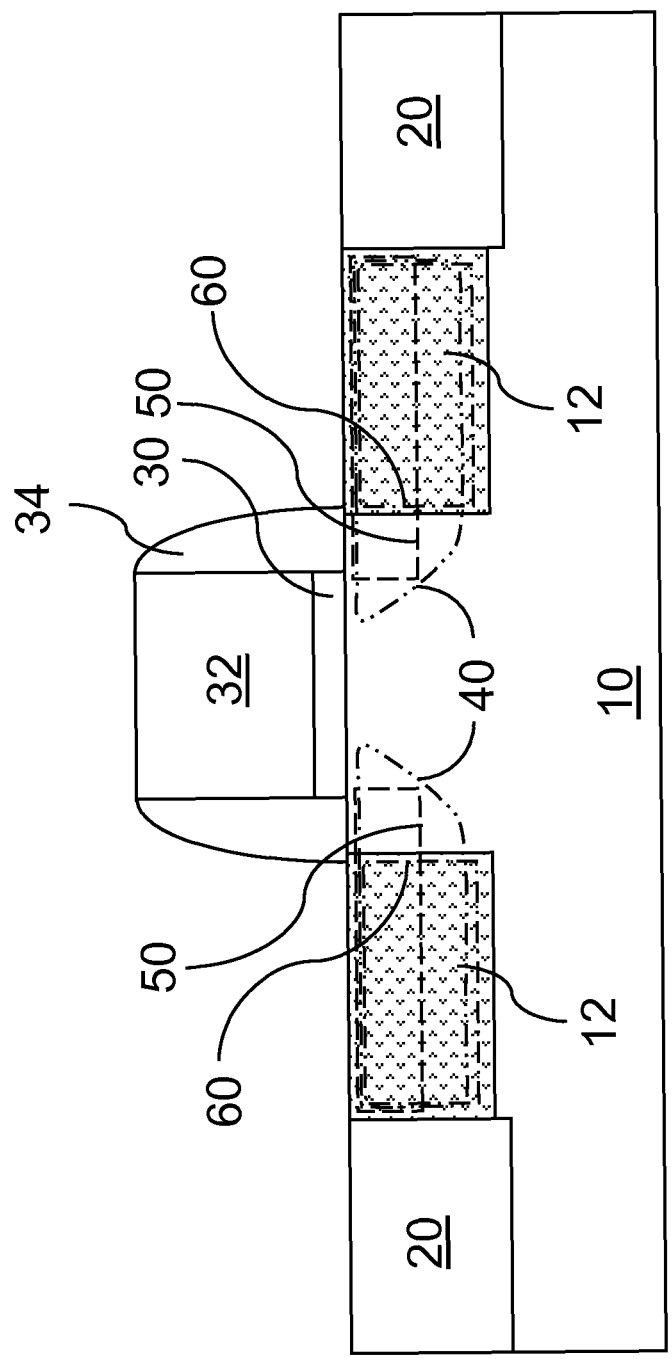
FIG. 4 is a vertical cross-sectional view of an exemplary semiconductor structure having embedded strained semiconductor material portions and various implanted regions.

Referring to FIG. 4, a vertical cross-sectional view of an exemplary semiconductor structure including a field effect transistor is shown. The field effect transistor is formed on a semiconductor substrate 10 comprising the first semiconductor material described above. Shallow trench isolation structures 20 comprising a dielectric material such as silicon oxide are formed beneath the top surface of the semiconductor substrate 10. After forming a gate dielectric 30, a gate electrode 32, and a dielectric gate spacer 34, portions of the semiconductor substrate 10 are removed and filled with the second semiconductor material described above to form strained semiconductor material portions. Included among the strained semiconductor material portions are embedded source and drain regions 12, which comprise the second semiconductor material having a lattice mismatch with the first semiconductor material of the semiconductor substrate. The embedded source and drain regions 12 are epitaxially aligned to the single crystalline lattice of the semiconductor substrate 10.

Among the ion implantation steps employed to form the field effect transistor are a halo ion implantation step, a source and drain extension ion implantation step, and a deep source and drain ion implantation step that is also referred to as a source and drain ion implantation step. The halo ion implantation step implants dopants of the same conductivity type as the doping type of the semiconductor substrate, which is herein referred to as a first conductivity type. The halo ion implantation step is a non-amorphizing ion implantation step. The source and drain extension ion implantation step and the deep source and drain ion implantation step implants dopants of the opposite conductivity type to the doping type of the semiconductor substrate. The conductivity type of the ions implanted during the source and drain extension ion implantation step and the deep source and drain ion implantation step is herein referred to as a second conductivity type, which is the opposite of the first conductivity type. The source and drain extension ion implantation step and the deep source and drain ion implantation step are an amorphizing ion implantation steps.

The halo ion implantation step forms halo regions 40 in the exemplary semiconductor structure. The source and drain extension ion implantation step forms source and drain extension regions 50 in the exemplary semiconductor structure. The deep source and drain ion implantation step forms deep source and drain regions 60 in the exemplary semiconductor structure. Typically, the source and drain extension regions 50 and the deep source and drain regions 60 are collectively called source and drain regions.

The halo ion implantation step is performed at an elevated temperature in the same manner as in the first embodiment. The source and drain extension implantation step is performed at a temperature lower than nominal room temperature range in the same manner as in the second embodiment. The deep source and drain implantation step is performed at a temperature lower than nominal room temperature range in the same manner as in the second embodiment. Optimal temperature settings are employed to maximize the retention of strain in the strained semiconductor material portions, i.e., in the embedded source and drain regions 12. This results in maximized strain in the embedded source and drain regions 12 after an activation anneal, which removes structural damages induced by the various ion implantation steps. By increasing the residual strain in the embedded source and drain regions 12, the strain in the channel of the field effect transistor is also increased. The increased retention of strain in the channel of the transistor results in increase in the mobility of charge carriers in the channel of the field effect transistor, increased on-current of the field effect transistor, decreased on-resistance of the field effect transistor, and decreased threshold voltage of the field effect transistor, thereby enhancing overall performance of the field effect transistor.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of performing processing steps for forming a semiconductor structure, said processing steps comprising:
    providing a semiconductor substrate including a first single crystalline semiconductor material;
    forming a strained semiconductor material portion directly on said semiconductor substrate, wherein said strained semiconductor material portion comprises a second single crystalline semiconductor material and is epitaxially aligned to, and is lattice-mismatched relative to, said first single crystalline semiconductor material of said semiconductor substrate, wherein a lattice mismatch between said first semiconductor material and said second semiconductor material is a source of a strain exerted on said strained semiconductor material portion by said first semiconductor material in said semiconductor substrate;

reducing a magnitude of said strain exerted on said strained semiconductor material portion by rendering said strained semiconductor material portion substantially amorphous through ion implantation of dopant ions into said strained semiconductor material portion without implanting said dopant ions into said first single crystalline semiconductor material at a cooled temperature within a range from −267 degrees Celsius to 10 degrees Celsius; and generating a residual strain in said strained semiconductor material portion by annealing said implanted strained semiconductor material portion at a temperature that removes structural damages induced by implantation of said dopant ions.

2. A method of performing processing steps for forming a semiconductor structure, said processing steps comprising:

providing a semiconductor substrate including a first single crystalline semiconductor material;

forming a strained semiconductor material portion directly on said semiconductor substrate, wherein said strained semiconductor material portion comprises a second single crystalline semiconductor material and is epitaxially aligned to, and is lattice-mismatched relative to, said first single crystalline semiconductor material of said semiconductor substrate, wherein a lattice mismatch between said first semiconductor material and said second semiconductor material is a source of a strain exerted on said strained semiconductor material portion by said first semiconductor material in said semiconductor substrate, wherein said first single crystalline semiconductor material of said semiconductor substrate is silicon, and said strained semiconductor material portion comprises a silicon germanium carbon alloy;

reducing a magnitude of said strain exerted on said strained semiconductor material portion by rendering said strained semiconductor material portion substantially amorphous through ion implantation of dopant ions into said strained semiconductor material portion without implanting said dopant ions into said first single crystalline semiconductor material at a cooled temperature within a range from −267 degrees Celsius to 10 degrees Celsius; and generating a residual strain in said strained semiconductor material portion by annealing said implanted strained semiconductor material portion at a temperature that removes structural damages induced by implantation of said dopant ions.

3. The method of claim 1, wherein said processing steps further comprise forming a gate dielectric and a gate electrode on said semiconductor substrate, wherein said strained semiconductor material portion is formed self-aligned to said gate electrode.

4. The method of claim 1, wherein said dopant ions are p-type dopant ions or n-type dopant ions.

5. The method of claim 1, wherein said dopant ions include at least one of B, $BF_2$, Ga, In, P, As, and Sb.

6. A method of performing processing steps for forming a semiconductor structure, said processing steps comprising:

providing a semiconductor substrate including a first single crystalline semiconductor material;

forming a strained semiconductor material portion directly on said semiconductor substrate, wherein said strained semiconductor material portion comprises a second single crystalline semiconductor material and is epitaxially aligned to, and is lattice-mismatched relative to, said first single crystalline semiconductor material of said semiconductor substrate, wherein a lattice mismatch between said first semiconductor material and said second semiconductor material is a source of a strain exerted on said strained semiconductor material portion by said first semiconductor material in said semiconductor substrate;

implanting first dopant ions into said strained semiconductor material portion at a non-amorphizing dose at a first temperature within a range from 30 degrees Celsius to 700 degrees;

reducing a magnitude of said strain exerted on said strained semiconductor material portion by rendering said strained semiconductor material portion substantially amorphous through ion implantation of second dopant ions into said strained semiconductor material portion without implanting said second dopant ions into said first single crystalline semiconductor material at a second temperature within a range from −267 degrees Celsius to 10 degrees Celsius; and generating a residual strain in said strained semiconductor material portion by annealing said strained semiconductor material portion after implanting said first and second dopant ions at a temperature that removes structural damages induced by implantation of said second dopant ions.

7. The method of claim 6, wherein said semiconductor material of said semiconductor substrate is silicon, and said strained semiconductor material portion comprises one of a silicon germanium alloy, a silicon carbon alloy, and a silicon germanium carbon alloy.

8. The method of claim 6, wherein said processing steps further comprise forming a gate dielectric and a gate electrode on said semiconductor substrate, wherein said strained semiconductor material portion is formed self-aligned to said gate electrode.

9. The method of claim 6, wherein said dopant ions are p-type dopant ions or n-type dopant ions.

10. The method of claim 9, wherein each of said first dopant ions and said second dopant ions include at least one of B, $BF_2$, Ga, In, P, As, and Sb.

11. A method of performing processing steps for forming a semiconductor structure, said processing steps comprising:

forming a gate dielectric and a gate electrode on a top surface of a single crystalline semiconductor layer comprising a first single crystalline semiconductor material and having a doping of a first conductivity type and located in a semiconductor substrate;

forming at least one strained semiconductor material portion comprising a second single crystalline semiconductor material and directly on said single crystalline semiconductor layer, wherein said at least one strained semiconductor material portion is epitaxially aligned to, and is lattice-mismatched relative to, said first single crystalline semiconductor material of said single crystalline semiconductor layer, wherein a lattice mismatch between said first semiconductor material and said second semiconductor material is a source of a strain exerted on said at least one strained semiconductor material portion by said first semiconductor material in said semiconductor substrate;

performing a halo ion implantation at a first temperature within a range from 30 degrees Celsius to 700 degrees Celsius, wherein dopant ions of said first conductivity type are implanted into said at least one strained semiconductor material portion at a non-amorphizing dose;

reducing a magnitude of said strain exerted on said at least one strained semiconductor material portion by rendering said at least one strained semiconductor material portion substantially amorphous by a source/drain ion implantation of second dopant ions at a second temperature within a range from −267 degrees Celsius to 10 degrees Celsius into said at least one strained semiconductor material portion without implanting said second dopant ions into said first single crystalline semiconductor material; and generating a residual strain in said strained semiconductor material portion by annealing said at least one strained semiconductor material portion after performing said halo ion implantation and said source/drain ion implantation at a temperature that removes structural damages induced by implantation of said second dopant ions.

12. The method of claim 11, wherein said single crystalline semiconductor layer is a silicon layer, and said at least one strained semiconductor material portion comprises one of a silicon germanium alloy, a silicon carbon alloy, and a silicon germanium carbon alloy.

13. The method of claim 11, wherein said first temperature is between 100 degrees Celsius and 600 degrees Celsius, and wherein said second temperature is between −200 degrees Celsius and 0 degrees Celsius.

14. The method of claim 13, wherein said first temperature is between 200 degrees Celsius and 500 degrees Celsius, and wherein said second temperature is between −200 degrees Celsius and −50 degrees Celsius.

15. The method of claim 11, wherein said processing steps further comprise performing a source/drain extension ion implantation at a third temperature within a range from −267 degrees Celsius to 10 degrees Celsius, wherein dopants of said second conductivity type are implanted into said at least one strained semiconductor material portion at an amorphizing dose employing said gate electrode as a self-aligning implantation mask.

16. The method of claim 11, wherein said strained semiconductor material portion is formed self-aligned to said gate electrode, and wherein each of said dopants of said first conductivity type and said dopants of said second conductivity type include at least one of B, $BF_2$, Ga, In, P, As, and Sb.

* * * * *